US006813003B2

(12) United States Patent
Oskotsky et al.

(10) Patent No.: US 6,813,003 B2
(45) Date of Patent: Nov. 2, 2004

(54) ADVANCED ILLUMINATION SYSTEM FOR USE IN MICROLITHOGRAPHY

(76) Inventors: Mark Oskotsky, 151 Fenimore Rd., Apt. 11B, Mamaroneck, NY (US) 10543; Lev Ryzhikov, 136 Newtown Ave. #7, Norwalk, CT (US) 06851; Scott Coston, 16 Arcadia La., New Milford, CT (US) 06776; James Tsacoyeanes, 96 Oak Hill Dr., Southbury, CT (US) 06488; Walter Augustyn, 35 Wiltan Dr., Monroe, CT (US) 06468

( * ) Notice: Subject to any disclaimer, the term of this patent is extended or adjusted under 35 U.S.C. 154(b) by 8 days.

(21) Appl. No.: 10/166,062

(22) Filed: Jun. 11, 2002

(65) Prior Publication Data

US 2003/0227609 A1 Dec. 11, 2003

(51) Int. Cl.[7] .......................... G03B 27/52; G03B 27/54
(52) U.S. Cl. ........................................ 355/67; 355/55
(58) Field of Search .............................. 355/53, 55, 67

(56) References Cited

U.S. PATENT DOCUMENTS

| 4,931,830 | A |   | 6/1990  | Suwa et al. ............... 355/71 |
|-----------|---|---|---------|-----------------------------------|
| 5,383,000 | A |   | 1/1995  | Michaloski et al. ........ 355/67 |
| 5,631,721 | A | * | 5/1997  | Stanton et al. ............ 355/71 |
| 5,675,401 | A |   | 10/1997 | Wangler et al. ............ 355/67 |
| 6,285,443 | B1 |   | 9/2001  | Wangler et al. ............ 355/67 |
| 6,307,682 | B1 | * | 10/2001 | Hoffman et al. ........... 359/663 |
| 6,563,567 | B1 | * | 5/2003  | Komatsuda et al. ......... 355/71 |
| 6,583,937 | B1 | * | 6/2003  | Wangler et al. ............ 359/624 |
| 2001/0055107 | A1 | * | 12/2001 | Tsuji ...................... 355/67 |
| 2002/0085276 | A1 | * | 7/2002 | Tanitsu et al. ............ 359/432 |
| 2002/0171944 | A1 | * | 11/2002 | Suenaga et al. ........... 359/689 |
| 2003/0025890 | A1 | * | 2/2003 | Nishinaga ................. 355/53 |
| 2003/0076679 | A1 |   | 4/2003 | Oskotsky et al. .......... 362/268 |

FOREIGN PATENT DOCUMENTS

| EP | 1 079 277 A1 | 2/2001 |
| EP | 1 248 151 A2 | 10/2002 |

OTHER PUBLICATIONS

Copy of search report from Australian Patent Appl. No. SG200304444–3, 6 pages, mailing date Jan. 6, 2004.

* cited by examiner

Primary Examiner—Rodney Fuller
(74) Attorney, Agent, or Firm—Sterne, Kessler, Goldstein & Fox PLLC

(57) ABSTRACT

A system for microlithography comprises an illumination source; an illumination optical system including, in order from an objective side, (a) a first diffractive optical element that receives illumination from the illumination source, (b) a zoom lens, (c) a second diffractive optical element, (d) a condenser lens, (e) a relay lens, and (f) a reticle, and a projection optical system for imaging the reticle onto a substrate, wherein the system for microlithography provides a zoomable numerical aperture.

96 Claims, 11 Drawing Sheets

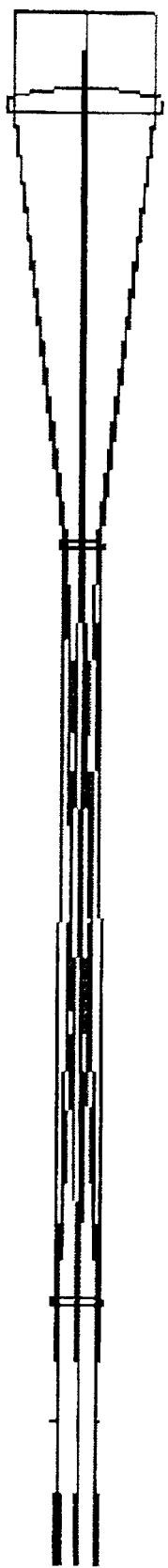

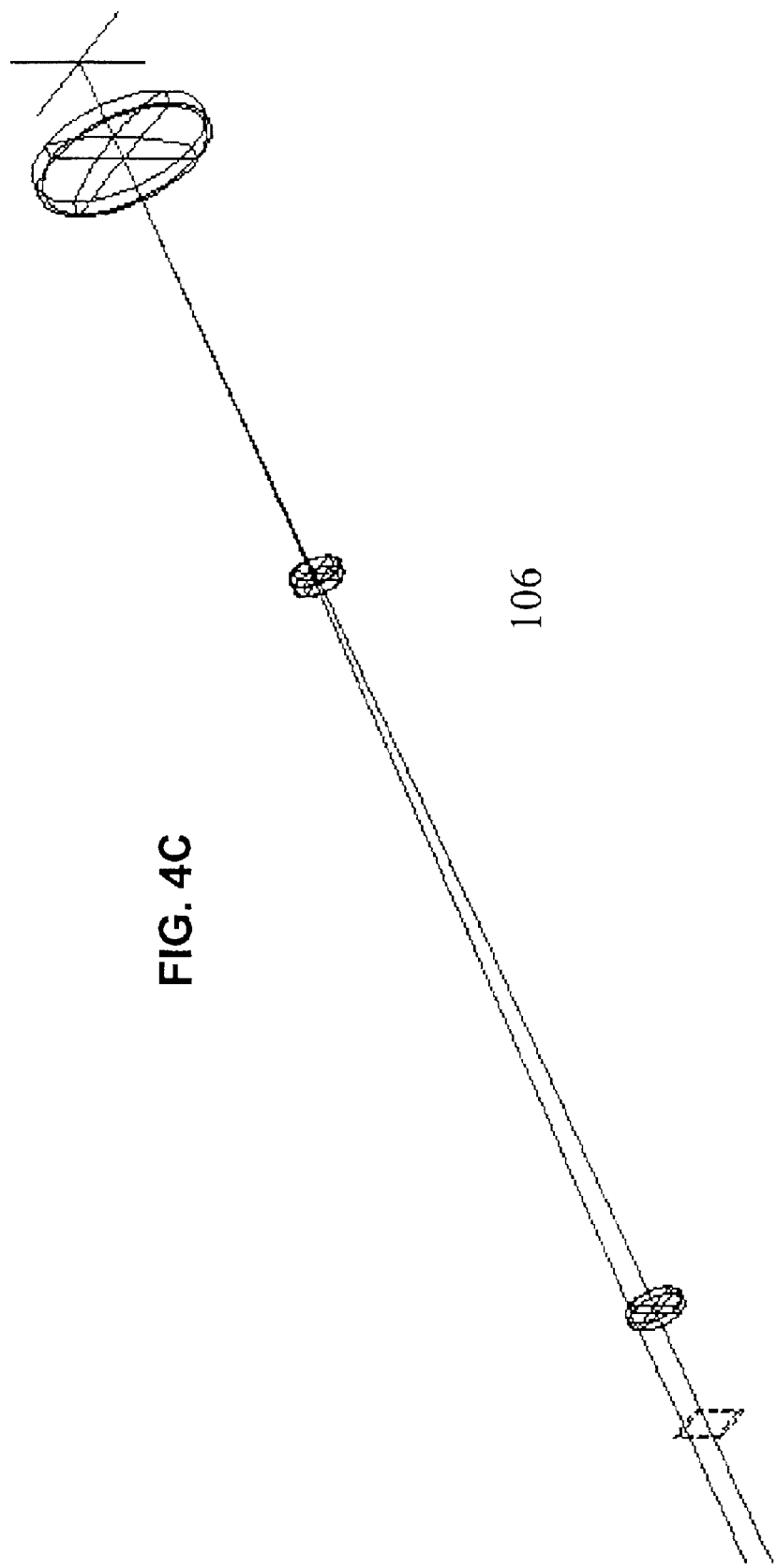

1x relay 108

NA=0.2125; Magnification=1X

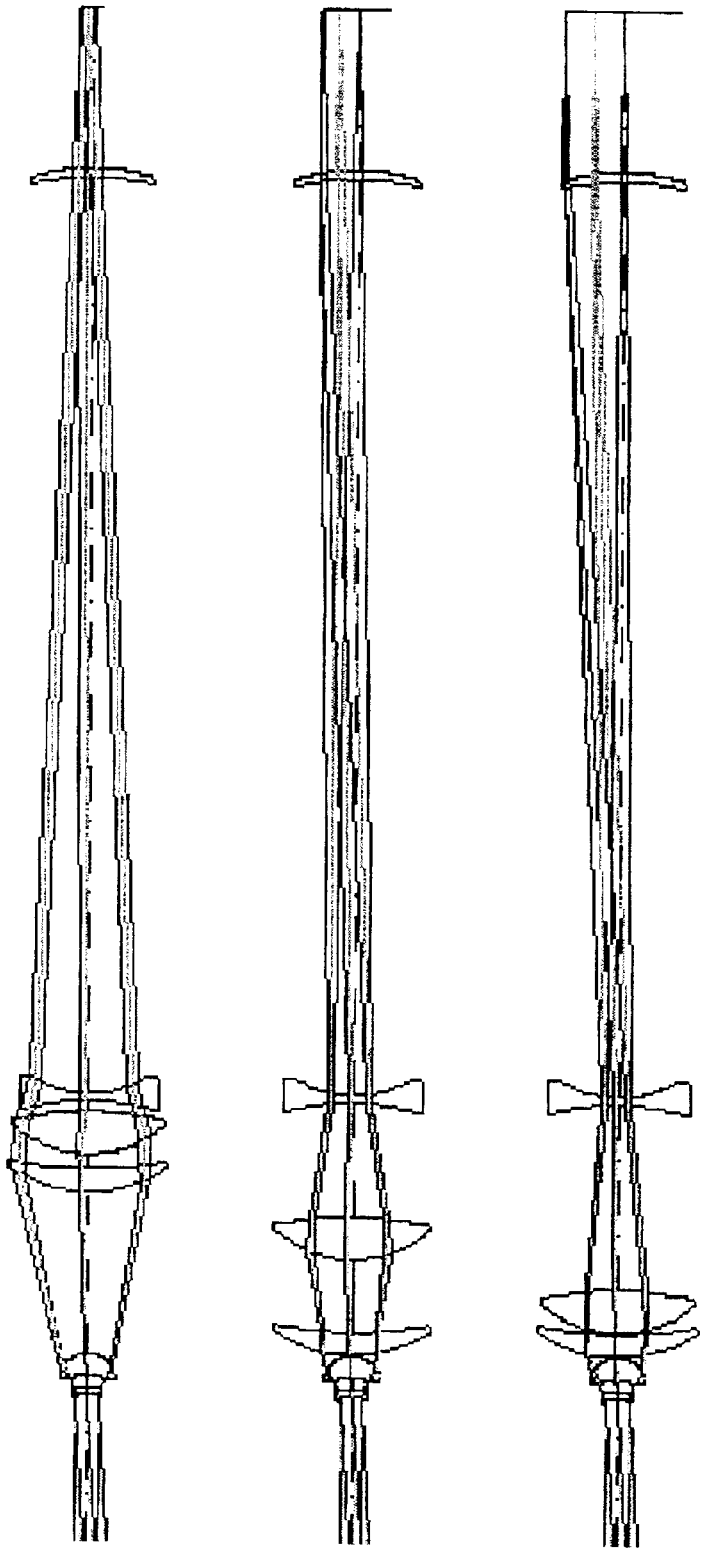

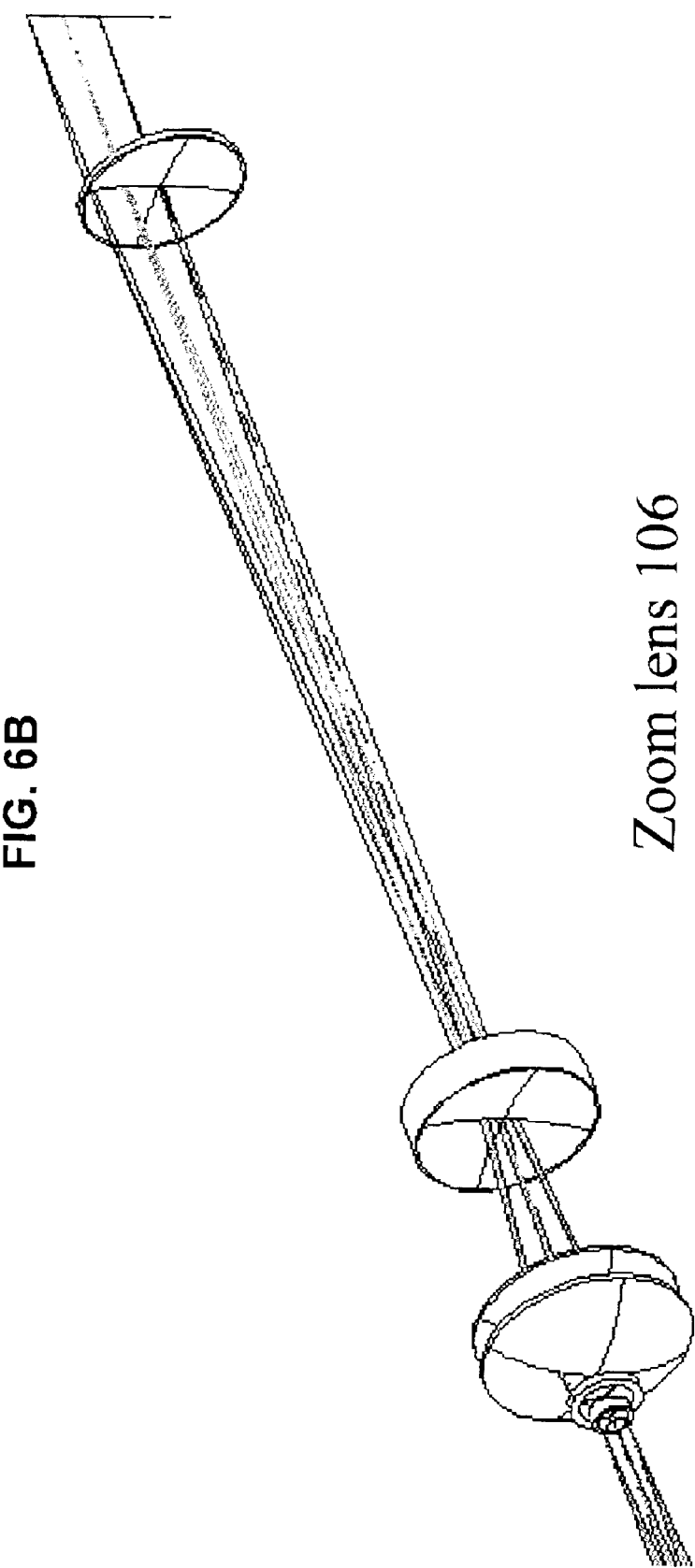

ADVANCED ILLUMINATION SYSTEM FOR USE IN MICROLITHOGRAPHY

BACKGROUND OF THE INVENTION

1. Field of the Invention

The present invention relates to microlithography, and more particularly, to illumination systems for microlithographic equipment that have high numerical apertures.

2. Related Art

Photolithography (also called microlithography) is used for manufacturing of semiconductor devices. Photolithography uses electromagnetic radiation, such as ultraviolet (UV), deep UV or visible light to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) containing a circuit pattern, a projection-system, and a wafer alignment stage for aligning a photosensitive resist-covered semiconductor wafer. The illumination system illuminates a region of the reticle with a preferably rectangular slot illumination field. The projection system projects an image of the illuminated region of the reticle circuit pattern onto the wafer.

As semiconductor device manufacturing technology advances, there are ever increasing demands on each component of the photolithography system used to manufacture the semiconductor device. This includes the illumination system used to illuminate the reticle. For example, there is a need to illuminate the reticle with an illumination field having uniform irradiance. In step-and-scan photolithography, there is also a need to vary a size of the illumination field so that the size of the illumination field can be tailored to different applications and semiconductor die dimensions.

Some illumination systems include an array or diffractive scattering optical element positioned before the reticle. The scattering optical element produces a desired angular light distribution that is subsequently imaged or relayed to the reticle.

Additionally, commonly-used die dimensions are 26×5 mm, 17×5 mm, and 11×5 mm. Thus, a standard zoom lens needs to accommodate variation in the size of the illumination field. However, a particular problem arises in the field of microlithography, where different features that are required to be formed on the semiconductor substrate require variable partial coherence on the part of the exposure optics. Specifically, partial coherence (σ), which in microlithography is commonly defined as the ratio of a numerical aperture of the illumination optics and a numerical aperture of the projection system, needs to vary depending on the nature of the feature being formed on the semiconductor substrate, e.g., the σ for trench formation may be different from the σ for line formation.

Accordingly, a need exists for a simple microlithographic system that can vary the partial coherence parameter over a large range, while simultaneously being able to accommodate different field sizes.

SUMMARY OF THE INVENTION

The present invention is directed to a microlithographic system that has variable partial coherence and field size.

One advantage of the present invention is being able to provide a microlithographic system with continuously adjustable partial coherence and discretely adjustable field size.

Another advantage of the present invention is being able to provide a microlithographic system where both partial coherence and field size can vary continuously.

Another advantage of the present invention is being able to provide a microlithographic system that can achieve the above objectives with the use of simple optics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a system for microlithography comprising an illumination source; an illumination optical system including, in order from an objective side, (a) a first diffractive optical element that receives illumination from the illumination source, (b) a zoom lens, (c) a second diffractive optical element, (d) a condenser lens, (e) a relay lens, and (f) a reticle, and a projection optical system for imaging the reticle onto a substrate, wherein the system for microlithography provides a zoomable numerical aperture.

In another aspect of the present invention there is provided a system for microlithography comprising an illumination source, an illumination optical system that receives illumination from the illumination source, and a projection optical system that receives illumination from the illumination system, wherein a ratio of a numerical aperture of the illumination system and a numerical aperture of the projection optical system is continuously variable while a field size is discretely variable.

In another aspect of the present invention there is provided an illumination system for microlithography comprising, in order from an objective side a first diffractive optical element, a zoom lens, a second diffractive optical element having a rectangular numerical aperture, a condenser lens, and a relay lens.

In another aspect of the present invention there is provided a system for microlithography comprising an illumination system including, in order from an objective side, (a) a zoom lens having a first diffractive optical element on a first side, and a second diffractive optical element on a second side, (b) a condenser lens, and (c) a relay lens, and a projection optical system, wherein a ratio of a numerical aperture of the illumination system and a numerical aperture of the projection optical system is continuously variable.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 4A–4C are a ray trace diagrams illustrating a condenser lens used in an embodiment of the present invention;

FIGS. 6A–6B are a ray trace diagrams illustrating a zoom lens used in an embodiment of the present invention;

DETAILED DESCRIPTION OF THE INVENTION

Reference will now be made in detail to the preferred embodiments of the present invention, examples of which are illustrated in the accompanying drawings.

In recent years, photolithography used in semiconductor device fabrication has been moving to gradually shorter wavelengths, as device features shrink in size. With feature sizes shrinking to sub- micron- and sub-0.1$\mu$ range, semiconductor manufacturers have had to shift to the use of ultraviolet light, and in some cases to soft X-ray lithography (or deep UV). For example, excimer lasers, which emit light in the 248, 193 and 157 nm range, are increasingly used in semiconductor device fabrication. The illumination source in modern microlithographic equipment, as noted above, is typically a visible light laser, an excimer laser, or possibly a soft X-ray source. (The terms "light" and "illumination" will be used interchangeably hereafter to refer to any electromagnetic radiation used for photoresist exposure.) The use of these wavelengths presents a particular challenge to the designer of semiconductor manufacturing equipment, and especially the optics used to focus and shape the beams from the excimer lasers. In the present invention, fused silica glass is preferred for 248 and 193 nm sources, while 157 nm sources typically require optical elements made of calcium fluoride or barium fluoride to effectively focus and shape the beam.

The embodiments described utilize both refractive and reflective optical elements. It will be understood by one of ordinary skill in the art, however, that the use of reflective surfaces is frequently dictated by engineering and design concerns, rather than fundamental principles of the invention. It is therefore understood that in the description that follows, the use of reflective (folding) optical elements is needed strictly due to engineering design choices, and their use is not required in order to practice the invention.

Figure 1:
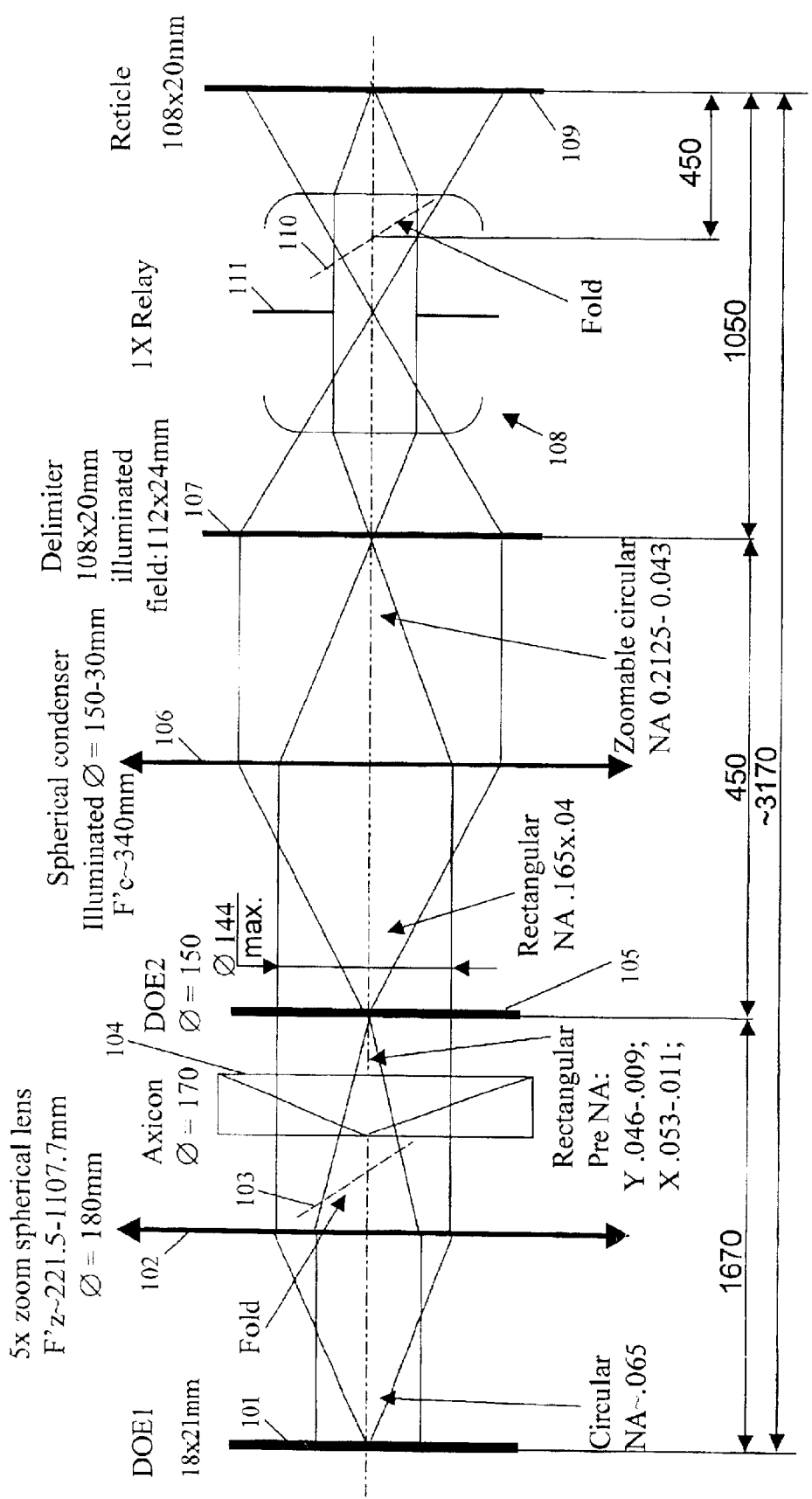
FIG. 1 is a schematic illustration of one embodiment of the present invention.

FIG. 1 illustrates a basic configuration of one preferred embodiment of the present invention. It will be appreciated that in the figures that follow, where appropriate, the dimensions are in millimeters.

As may be seen in FIG. 1, this embodiment of the present invention includes a diffractive optical element 101 (DOE1), which is illuminated by an illumination source (not shown).

The first diffractive optical element 101 may be any element commonly used to produce diffraction, such as 2-D array of spherical microlenses, a Fresnel lens, a diffraction grating, etc.

From a system perspective, as illustrated in FIG. 1, the numerical aperture of the beam after the first diffractive optical element 101 is approximately 0.065.

As may be further seen from FIG. 1, after passing through the first diffractive optical element 101, the beam then illuminates a zoom lens 102. In the this embodiment, the zoom lens 102 is a 5× zoom spherical lens, with a focal length of 221.5–1107.7 mm. The diameter of the beam at this point is 180 mm. The zoom lens 102 is further illustrated in FIG. 6. It will be appreciated by one of ordinary skill in the art that the zoom lens 102 can use more or fewer elements, as required. One (six element design) is illustrated by the following prescription (a CODE V output):

|  | RDY | THI | GLA |
|---|---|---|---|
| >OBJ: | INFINITY | INFINITY |  |
| STO: | INFINITY | 8.000000 |  |
| 2: | −25.24705 | 5.000000 | 'CaF2' |
| 3: | 55.68759 | 16.548834 |  |
| 4: | −48.92714 | 25.342815 | 'CaF2' |
| ASP: |  |  |  |
| K : 1.779039 | KC : 0 |  |  |
| IC : YES | CUF : 0.000000 | CCF : 100 |  |
| A :0.146865E − 05 | B :0.705843E − 08 | C :−.823569E − 11 | D :0.127469E − 13 |
| AC : 0 | BC : 0 | CC : 0 | DC : 0 |
| 5: | −36.47260 | 194.914260 |  |
| 6: | 170.18706 | 28.207990 | 'CaF2' |
| 7: | 510.72551 | 17.527333 |  |
| 8: | 141.82233 | 51.966932 | 'CaF2' |
| 9: | −277.74471 | 12.376464 |  |
| ASP: |  |  |  |
| K : −3.017335 | KC : 0 |  |  |
| IC : YES | CUF : 0.000000 | CCF : 100 |  |
| A :0.913504E − 07 | B :−.173047E − 11 | C :−.291669E − 15 | D :0.148478E − 19 |
| AC : 0 | BC : 0 | CC : 0 | DC : 0 |
| 10: | −297.59579 | 10.000000 | 'CaF2' |
| 11: | 143.26243 | 1101.010134 |  |
| 12: | −352.19780 | 11.373314 | 'CaF2' |
| 13: | −154.19122 | 187.731924 |  |
| ASP: |  |  |  |
| K : −500.000000 | KC : 0 |  |  |
| IC: YES | CUF: 0.000000 | CCF: 100 |  |
| A :−.125463E − 05 | B :0.451681E − 09 | C :−.724157E − 13 | D :0.418162E − 17 |
| AC: 0 | BC: 0 | CC: 0 | DC: 0 |
| IMG: | INFINITY | 0.000000 |  |

-continued

| SPECIFICATION DATA | | | |
|---|---|---|---|
| EPD | 27.66000 | | |
| DIM | MM | | |
| WL | 157.63 | | |
| XAN | 0.00000 | 0.00000 | 0.00000 |
| YAN | 0.00000 | 1.85600 | 3.71900 |
| WTF | 3.00000 | 2.00000 | 2.00000 |
| VUY | 0.00000 | 0.00000 | 0.00000 |
| VLY | 0.00000 | 0.00000 | 0.00000 |
| REFRACTIVE INDICES | | | |
| GLASS CODE | | 157.63 | |
| 'CaF2' | | 1.558739 | |

| ZOOM DATA | POS 1 | POS 2 | POS 3 |
|---|---|---|---|
| VUY F1 | 0.00000 | 0.00000 | 0.00000 |
| VLY F1 | 0.00000 | 0.00000 | 0.00000 |
| VUY F2 | 0.00000 | 0.00000 | 0.00000 |
| VLY F2 | 0.00000 | 0.00000 | 0.00000 |
| VUX F1 | 0.00000 | 0.00000 | 0.00000 |
| VLX F1 | 0.00000 | 0.00000 | 0.00000 |
| VUX F2 | 0.00000 | 0.00000 | 0.00000 |
| VLX F2 | 0.00000 | 0.00000 | 0.00000 |
| THI S5 | 194.91426 | 1.00000 | 1.00000 |
| THC S5 | 0 | 0 | 0 |
| THI S7 | 17.52733 | 86.68062 | 1.45028 |
| THC S7 | 0 | 0 | 0 |
| THI S9 | 12.37646 | 137.13744 | 222.36778 |
| THC S9 | 0 | 0 | 0 |
| INFINITE CONJUGATES | | | |
| EFL | 221.5400 | 664.6200 | 1107.7000 |
| BFL | 164.6663 | 35.0875 | 11.1078 |
| FFL | 115.3771 | 610.2350 | 1583.8486 |
| FNO | 8.0094 | 24.0282 | 40.0470 |
| IMG DIS | 187.7319 | 187.7319 | 187.7319 |
| OAL | 1482.2681 | 1482.2681 | 1482.2681 |
| PARAXIAL IMAGE | | | |
| HT | 14.4001 | 43.2004 | 72.0006 |
| ANG | 3.7190 | 3.7190 | 3.7190 |
| ENTRANCE PUPIL | | | |
| DIA | 27.6600 | 27.6600 | 27.6600 |
| THI | 0.0000 | 0.0000 | 0.0000 |
| EXIT PUPIL | | | |
| DIA | 53.1110 | 30.1251 | 19.3446 |
| THI | 590.0538 | 758.9393 | 785.8026 |
| STO DIA | 27.6600 | 27.6600 | 27.6600 |

As further illustrated in FIG. 1, a fold (mirror) 103 may be used in this embodiment to manage and reduce overall tool size by folding the optical path. As noted above, the use of a mirror 103 is optional, and is generally dictated by engineering/design choices.

After reflecting off the fold mirror 103, the beam then illuminates an axicon 104 (working diameter of 170 mm). After passing through the axicon 104, the beam has a rectangular numerical aperture of 0.046–0.009 in the Y dimension, and 0.053–0.011 in the X dimension.

After passing through the axicon 104, the beam then passes through the second diffractive element (DOE2) 105. The second diffractive element 105 is preferably a binary diffractive array. One example is a array of cylindrical micro-lenses. The specification for the second diffractive optical element 105 may be as follows:

Coherence length in mm, X&Y:

248 nm temporal—no specs. spatial 0.35×0.15

193 nm temporal—3, spatial 0.6×0.085

X & Y beam divergence, mrad 248 nm+/−3.5×+/−3.5

193 nm+/−1×+/−1.75

Beam size (nm), X & Y; 6×16; 20×20; 12×32

After passing through the second diffractive array 105, the numerical aperture of the beam is approximately 0.165× 0.04.

The beam then passes through a spherical condenser lens 106. A-condenser lens 106 usable in this embodiment can have the following characteristics:

| | RDY | THI | GLA |
|---|---|---|---|
| > OBJ: | INFINITY | INFINITY | |
| STO: | INFINITY | 75.000000 | |
| 2: | 323.84000 | 5.000000 | 'CaF2' |

-continued

|     | RDY      | THI        | GLA   |
|-----|----------|------------|-------|
| 3:  | INFINITY | 491.500000 |       |
| 4:  | −145.94000 | 5.000000 | 'CaF2' |
| 5:  | 106.10000 | 278.500000 |     |
| 6:  | −2090.20000 | 15.000000 | 'CaF2' |
| 7:  | −196.34000 | 50.000000 |      |
| IMG:| INFINITY | 0.000000   |       |

In this embodiment, the condenser lens 106 has a focal length of 340 mm (generally, it is expected that the condenser lens 106 will have a focal length of 300–400 mm), and the illuminated diameter is 150–30 mm.

After passing through the spherical condenser lens, the beam has a zoomable circular numerical aperture of 0.2125–0.043. The beam then encounters a delimiter 107 (i.e., a stop), such that the illuminated field of 112×24 mm becomes 108×22 mm. The delimiter 107 is optically conjugate with a reticle 109 through the use of a relay lens 108 (for example, a 1× relay, or a 3×–4× relay). For design purposes, a fold 110 may be placed within the relay 108. A stop 111 is placed in the center of the relay lens 108, for a telecentric illumination system.

The relay lens 108 is used to conjugate a plane of a delimiter 107 with a plane of a reticle 109. An example of a 1× relay lens 108 prescription is shown below (here, a 10-element design):

A projection optical system (not shown) images the reticle down onto the semiconductor wafer (typically reducing image size by 4×, to 26×5 mm, 17×5 mm, or 11×5 mm).

It will be appreciated by one of ordinary skill in the art that the use of the axicon 104 in such a system improves the system's optical properties, but the invention may work without it. It will also be appreciated by one of ordinary skill in the art that the positions of the axicon 104 and the second diffractive element 105 can be reversed (i.e., the axicon 104 may be downstream from the second diffractive element 104), although it is believed at the present time that the arrangement shown in FIG. 1 is preferred.

Figure 2:
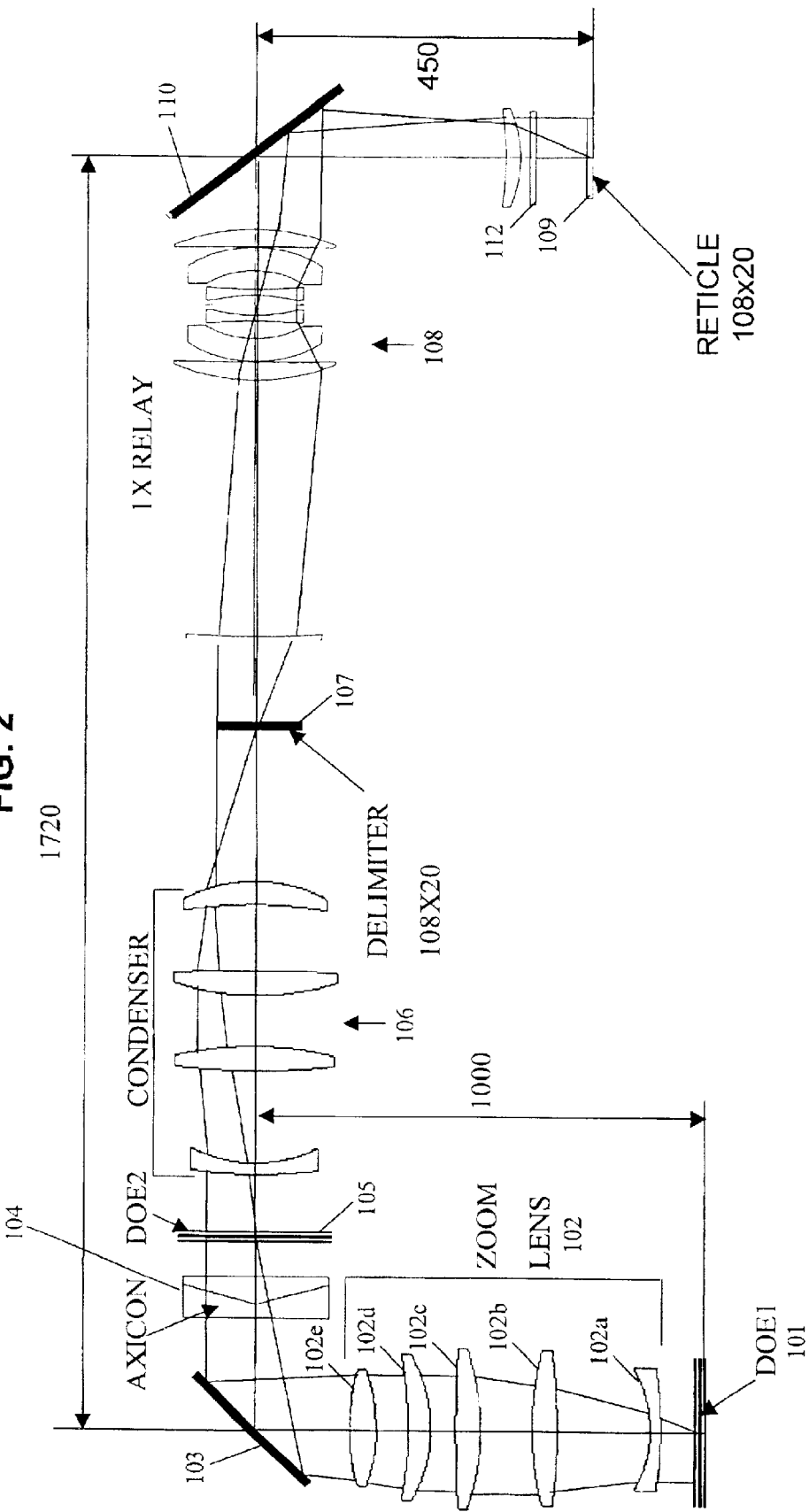
FIG. 2 is another illustration of the embodiment of FIG. 1, showing the lens arrangement.

FIG. 2 illustrates in greater detail the arrangement of the optical elements of the illumination system. In particular, FIG. 2 shows the zoom lens 102 (shown as a 5-element design) and its constituent elements 102a, 102b, 102c, 102d and 102e. FIG. 2 further shows the constituent elements of the condenser lens 106 (shown here as a four-element lens), and the 1× relay 108 (shown here as an 8-element design). It further illustrates the position of the λ/4 plate, and the reticle (mask) 109, which is optically conjugate with the plane of the delimiter 107 through the relay lens 108.

Figure 7:
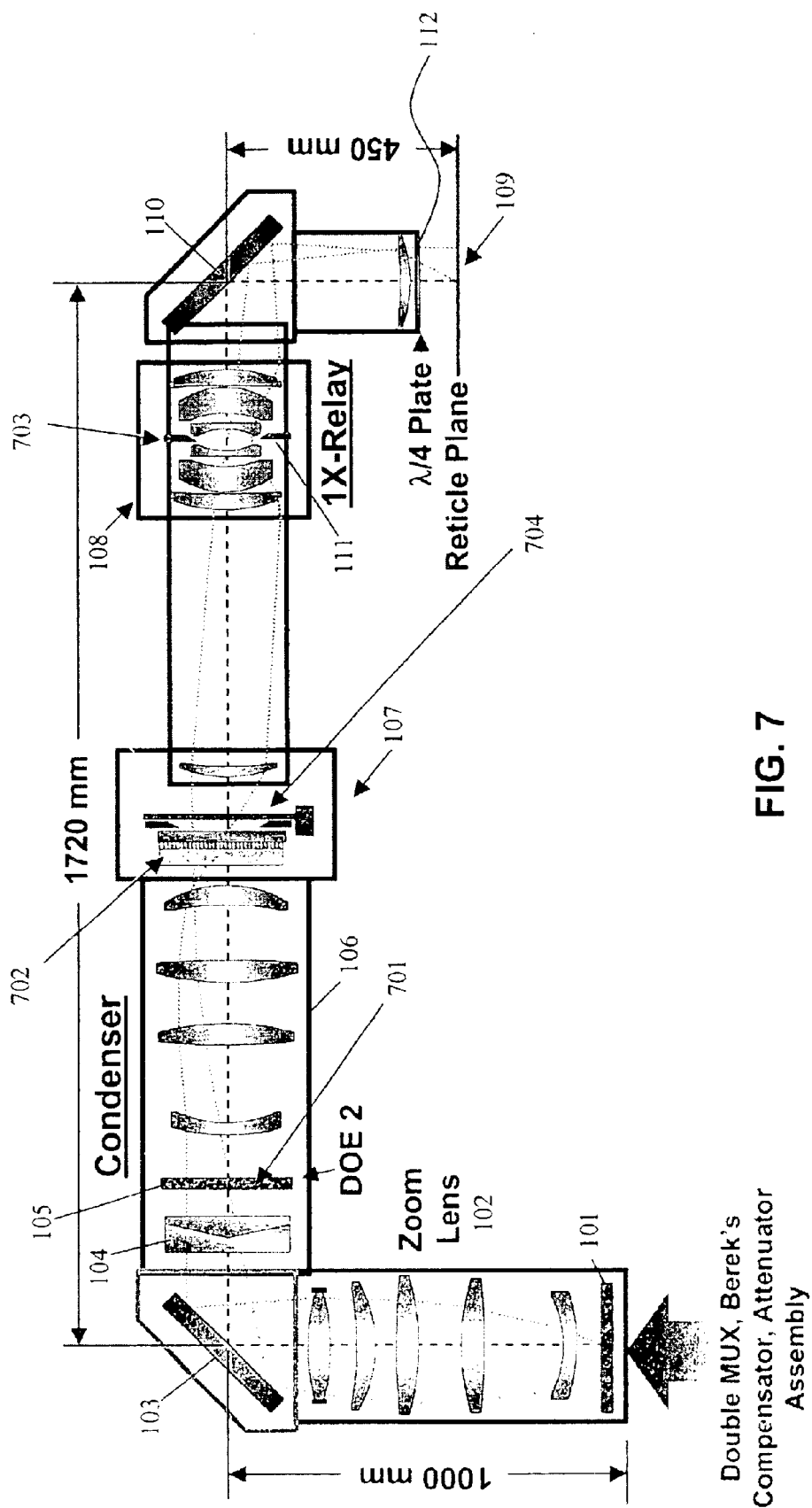
FIG. 7 illustrates an overall design of the illumination system, such as that shown in FIG. 1.

FIG. 7 is another illustration of the embodiment of FIG. 1, showing additional elements commonly found in a real-life microlithography system. All the optical elements illustrated in FIG. 1 are shown in FIG. 7, using the same reference numerals. In addition, FIG. 7 also shows a changer unit 701 for the second diffractive optical element 105. It is anticipated that in order to achieve different field sizes, different diffractive optical elements, having different numerical apertures, may need to be used. Accordingly, the

|        | RDY         | THI         | GLA      |
|--------|-------------|-------------|----------|
| >OBJ:  | INFINITY    | 73.362171   | AIR      |
| 1:     | 169.24669   | 15.000000   | 'NCaF2'  |
| ASP:   |             |             |          |
| K : −0.916442 |      |             |          |
| IC : YES | CUF: 0.000000 |         |          |
| A :0.000000E + 00 | B :0.000000E + 00 | C :0.000000E + 00 | D :0.000000E + 00 |
| 2:     | 297.03762   | 280.000000  |          |
| 3:     | 607.71047   | 32.530979   | 'NCaF2'  |
| 4:     | −296.65731  | 1.000000    |          |
| CON:   |             |             |          |
| K : −2.313366 |     |             |          |
| 5:     | 172.28333   | 33.841572   | 'NCaF2'  |
| 6:     | 4765.41367  | 1.000000    | AIR      |
| 7:     | 129.90270   | 40.919042   | 'NCaF2'  |
| 8:     | 103.26821   | 29.576441   |          |
| 9:     | −306.34576  | 8.000000    | 'NCaF2'  |
| 10:    | 162.90100   | 15.103930   |          |
| STO:   | INFINITY    | 15.104002   |          |
| 12:    | −162.90100  | 8.000000    | 'NCaF2'  |
| 13:    | 306.34576   | 29.576441   |          |
| 14:    | −103.26821  | 40.919042   | 'NCaF2'  |
| 15:    | −129.90270  | 1.000000    |          |
| 16:    | −4765.41367 | 33.841572   | 'NCaF2'  |
| 17:    | −172.28333  | 1.000000    |          |
| 18:    | 296.65731   | 32.530979   | 'NCaF2'  |
| CON:   |             |             |          |
| K : −2.313366 |     |             |          |
| 19:    | −607.71047  | 280.000000  |          |
| 20:    | −297.03762  | 15.000000   | 'NCaF2'  |
| 21:    | −169.24669  | 73.362171   |          |
| ASP:   |             |             |          |
| K : −0.916442 |     |             |          |
| IC: YES | CUF: 0.000000 |          |          |
| A :0.000000E + 00 | B:0.000000E+00 | C:0.000000E+00 | D:0.000000E+00 |
| IMG:   | INFINITY    | 0.000000    | AIR      |
| XDE: 0.000000 | YDE: 0.000000 | ZDE: 0.000000 | DAR |
| ADE: 0.000000 | BDE: 0.000000 | CDE: 0.000000 |     | changer unit 701 illustrated in FIG. 7 can be used for that purpose. It will also be appreciated that a similar changer unit may be used for the first diffractive optical element 101, if necessary.

FIG. 7 also illustrates the dynamic adjustable slit 702, which is part of the delimiter 107 assembly. The adjustable slit 702 is further described in U.S. Pat. No. 5,966,202, which is incorporated by reference herein. Together with the field framing assembly 704, they are used to ensure that the proper beam size exists at the delimeter plane, which is optically conjugate with the reticle plane.

FIG. 7 also illustrates the cleanup aperture assembly 703, which is used as a telecentric stop at the center of the relay lens. (See U.S. Pat. No. 6,307,619, which is incorporated by reference herein).

FIG. 7 also illustrates the position of the $\lambda/4$ plate 112, above plane of the reticle 108 and below the last optical element (lens) of the relay lens 108.

Although the preferred embodiments of the present invention describe a system used for exposure of discrete field sizes (26×5 mm, 17×5 mm, and 11×5 mm), it is expected that the system can be made to have a continuously variable field size. This could be accomplished by the addition of other diffractive optical elements in the optical path, similar to the second diffractive optical element 105. By the addition of one or two such elements, (e.g., additional binary diffractive arrays, or cylindrical microlens arrays), which may be placed between the condenser lens and the second diffractive optical element, and by adjusting its position along the optical axis, it is possible to achieve a microlithographic system that has both a continuously variable partial coherence, and a continuously variable field size at the wafer.

The use of a projection optical system (not illustrated in the figures) is well-known in the art, and is typically a 4× lens that reduces the reticle image down onto the wafer.

The description of another embodiment below, and the corresponding figures, use the same reference numerals to designate the same elements as in the embodiment of FIG. 1.

Figure 3:
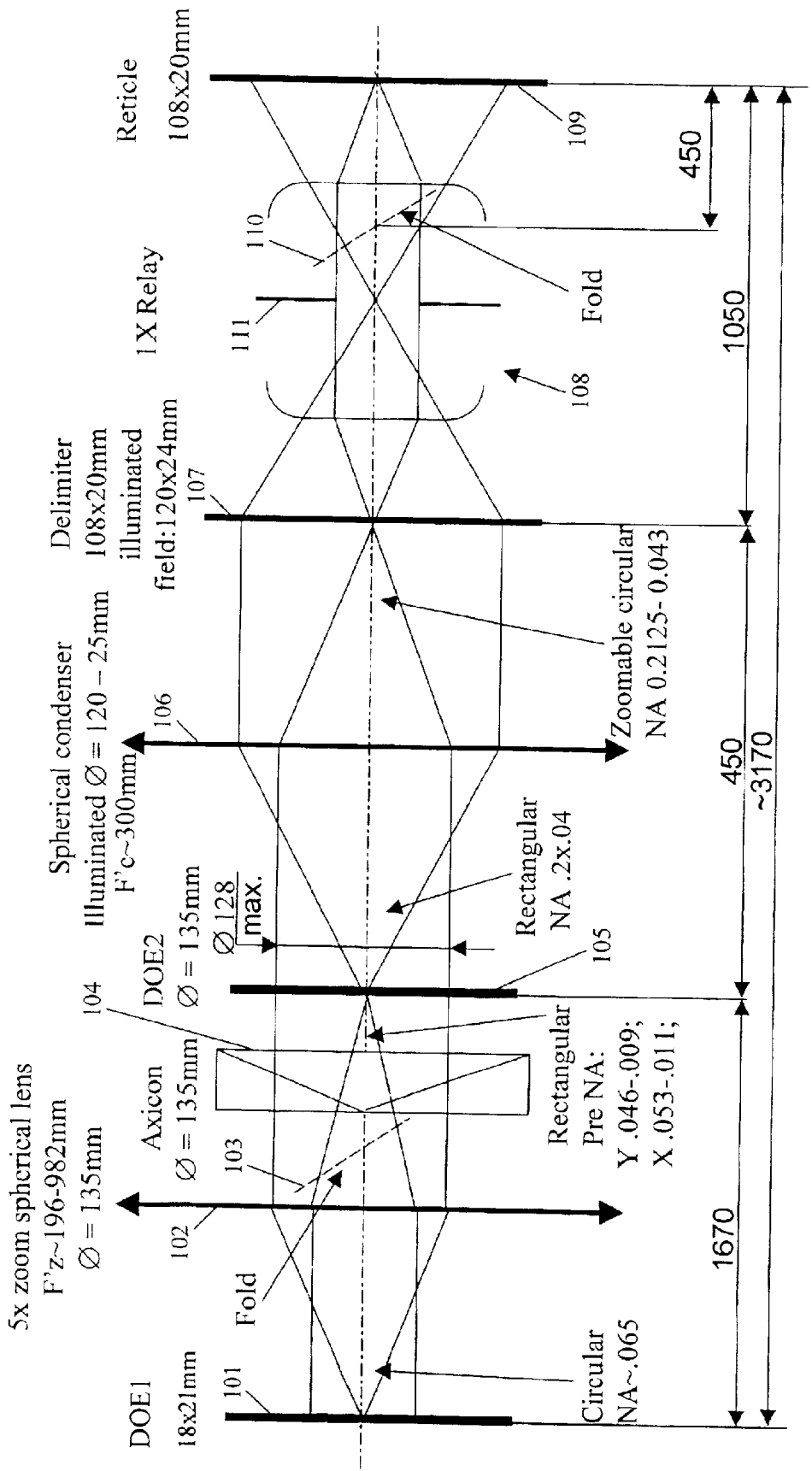
FIG. 3 is a schematic illustration of another embodiment of the present invention.
Figure 4B:
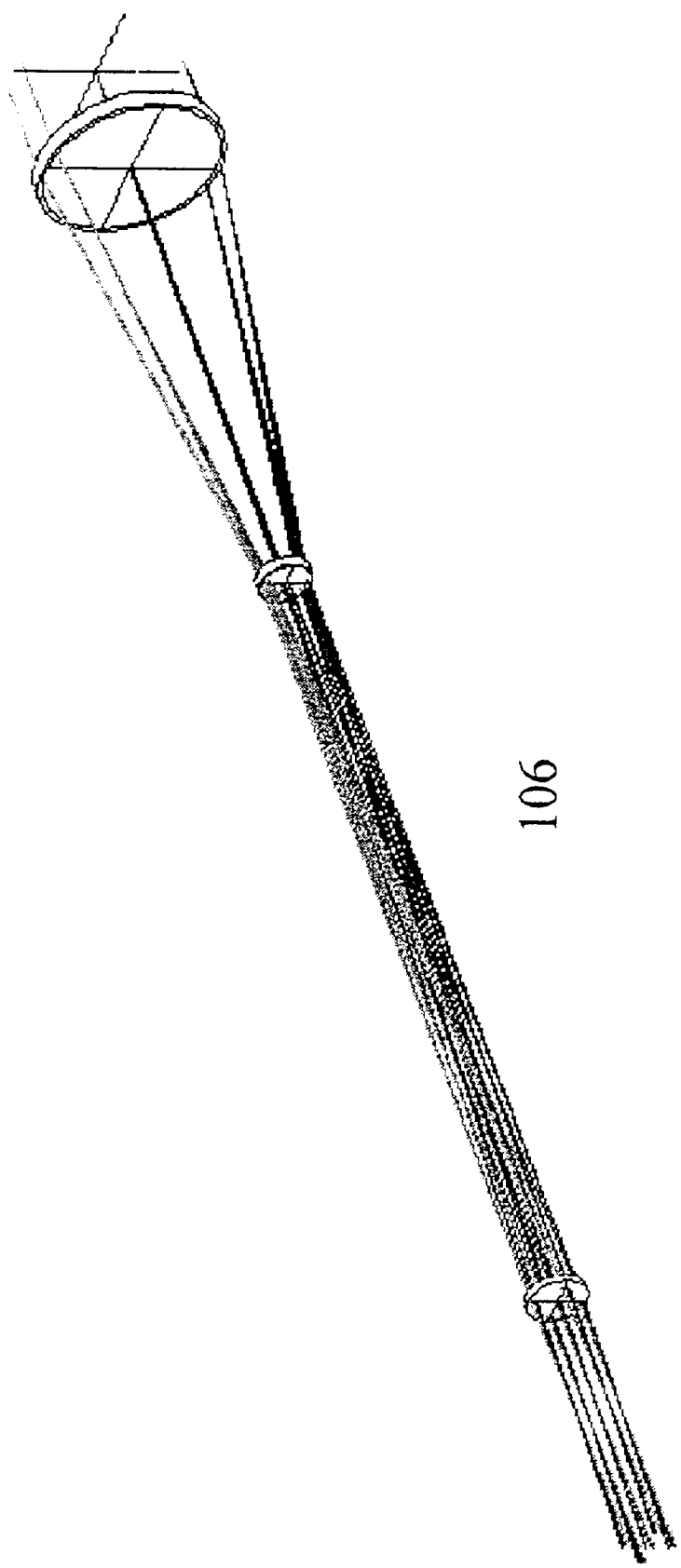
Figure 5A:
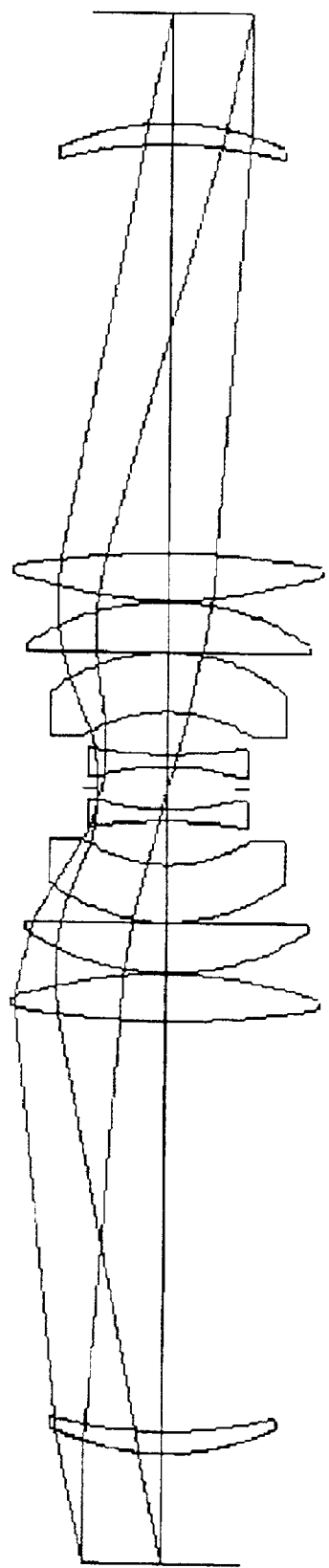
FIGS. 5A–5B are a ray trace diagrams illustrating a relay lens used in an embodiment of the present invention.
Figure 5B:
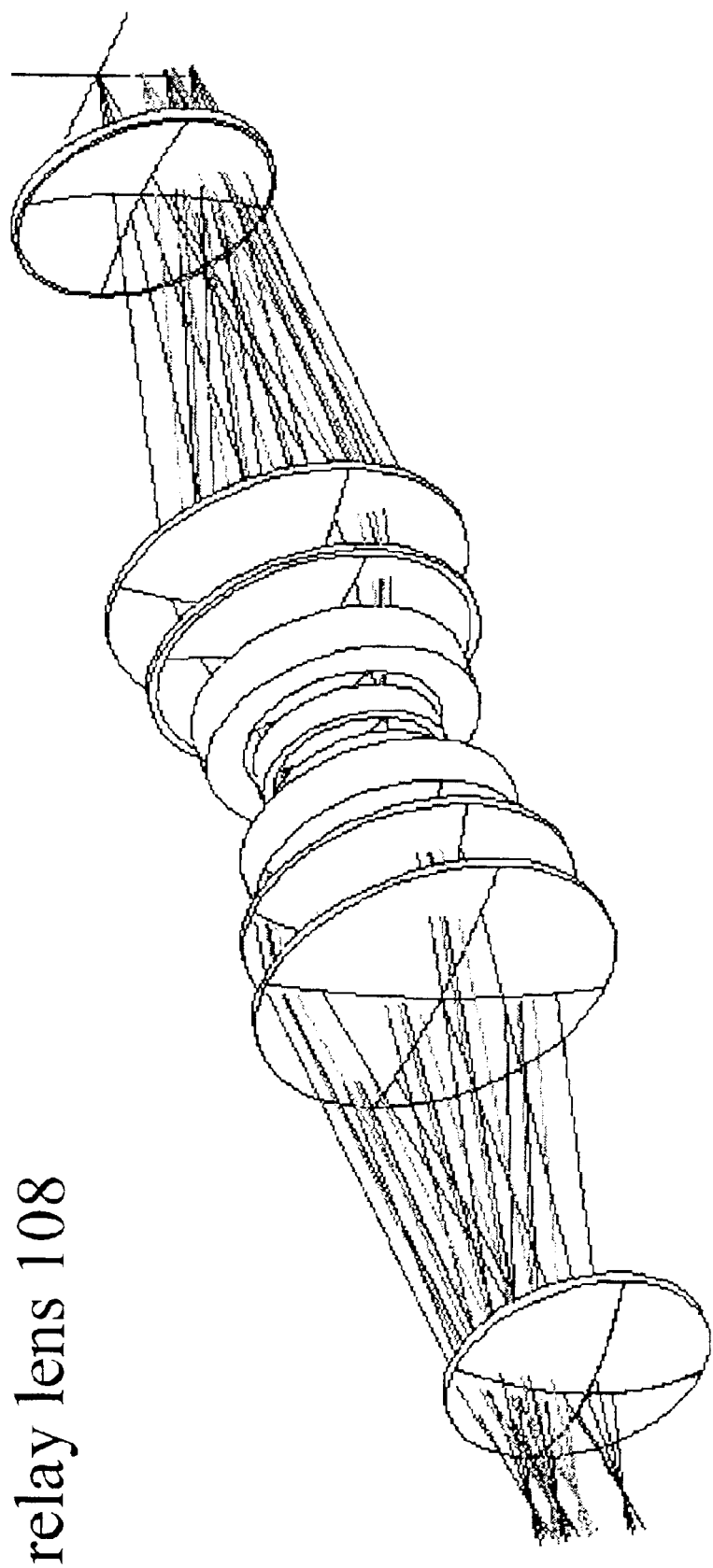

FIG. 3 illustrates the basic configuration of another preferred embodiment of the present invention. As may be seen in FIG. 3, this embodiment of the present invention includes a diffractive optical element 101, which is illuminated by an illumination source (not shown).

The first diffractive optical element (DOE1) 101 may be any refractive or reflective element commonly used to produce diffraction, such as an array of spherical microlenses, a Fresnel lens, a diffraction grating, etc. The numerical aperture of the beam after the first diffractive optical element 101 is approximately 0.065 (circular).

As may be further seen from 102, after passing through DOE1 101, light then illuminates a zoom lens 102. In this embodiment, the zoom lens 102 is a 5× zoom spherical lens, with a focal length of 196–982 mm. The diameter of the beam at this point is 135 mm. In this embodiment, the zoom lens 102 is a five-element lens.

After passing though the zoom lens 102 and reflecting off a fold mirror 103, the beam then illuminates an axicon 104. After passing through the axicon 104, the beam has a rectangular numerical aperture of 0.46–0.009 in the Y dimension, and 0.053–0.011 in the X dimension.

After passing through the axicon 104, the beam then passes through the second diffractive element (DOE2) 105 (beam diameter 135 mm). The second diffractive element 105 is preferably a binary diffractive array. One example is a array of cylindrical micro-lenses. After passing through the second diffractive array 105, the numerical aperture of the beam becomes 0.2×0.04.

The beam then passes through a condenser lens 106. In this embodiment, the condenser lens 106 has a focal length of 300 mm, and the illuminated diameter is 120–25 mm.

After passing through the spherical condenser lens, the beam has a zoomable circular numerical aperture of 0.2125–0.043. The beam then encounters a delimiter 107 (i.e., a stop), such that the illuminated field of 120×24 mm becomes 108×20 mm. The delimiter 107 is optically conjugate with a reticle 111, through the use of a relay lens 108. The relay lens 108 is used to conjugate the plane of the delimiter 107 with the plane of the reticle. For design purposes, a fold 110 may be placed within the relay lens 108. A stop 109 is placed in the center of the relay lens, for a telecentric illumination system.

A projection optical system (not shown) images the reticle 111 down onto the semiconductor wafer (typically reducing image size by 4×).

It will be appreciated by one of ordinary skill in the art that a relay lens is not always necessary to practice the invention, since the optical planes of the reticle and the delimiter are conjugate with each other. However, in most practical systems, a relay lens is used in order to ensure proper size of the field at the reticle plane, due to mechanical constraints.

Additionally, it will be appreciated that the field size may also be made continuous through the use of additional second diffractive elements, similar in nature to the second diffractive element 105 described above. Alternatively, a more complex zoom lens, or the use of a second zoom lens, may be used to achieve the same purpose.

Further, it will be appreciated that the present invention allows for the use of an even lower partial coherence $\sigma$, e.g., 0.001, if needed. A more complex zoom lens (or multiple zoom lenses) would be needed to achieve this.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A system for microlithography comprising:
    an illumination source;
    an illumination optical system including, in order from an objective side:
        (a) a first diffractive optical element that receives illumination from said illumination source;
        (b) a zoom lens;
        (c) a second diffractive optical element;
        (d) a condenser lens;
        (e) a relay lens;
        (f) a reticle; and
    a projection optical system that images said reticle onto a substrate,
    wherein said system for microlithography provides a zoomable numerical aperture.

2. The system of claim 1, wherein a field size of said system is discretely variable.

3. The system of claim 1, wherein a field size of said system is discretely variable and a ratio of a numerical aperture of said illumination optical system and a numerical aperture of said projection optical system is continuously variable.

4. The system of claim 1, wherein a field size of said system is continuously variable.

5. The system of claim 1, further including a third diffractive optical element between said second diffractive optical element and said condenser lens.

6. The system of claim 5, wherein a position of said third diffractive optical element is adjustable to continuously adjust a field size of said system.

7. The system of claim 1, wherein a ratio of a numerical aperture of said illumination system and a numerical aperture of said projection optical system is continuously variable.

8. The system of claim 7, wherein said ratio is continuously variable between about 0.2 and 0.4.

9. The system of claim 1, wherein said first diffractive optical element includes a microlense array.

10. The system of claim 1, wherein said first diffractive optical element includes a Fresnel lens.

11. The system of claim 1, wherein said first diffractive optical element includes a diffraction grating.

12. The system of claim 1, wherein said illumination system further includes an axicon between said zoom lens and said second diffractive element.

13. The system of claim 1, wherein said illumination system further includes an axicon between said second diffractive element and said condenser lens.

14. The system of claim 1, wherein said second diffractive optical clement has a rectangular numerical aperture.

15. The system of claim 1, wherein said second diffractive optical element includes a microlens array.

16. The system of claim 15, wherein said microlens array of said second diffractive optical element includes an array of cylindrical lenses.

17. The system of claim 1, wherein said illumination system further includes a telecentric stop centered in said relay lens.

18. A system for microlithography comprising: an illumination source; a whole field illumination optical system that receives illumination from said illumination source; and a projection optical system that receives illumination from said illumination system, wherein a ratio of a numerical aperture of said illumination system and a numerical aperture of said projection optical system is continuously variable while a field size is discretely variable.

19. The system of claim 18, wherein said illumination system further includes a first diffractive optical element that receives illumination from said illumination source.

20. The system of claim 19, wherein said first diffractive optical element includes a microlens array.

21. The system of claim 19, wherein said first diffractive optical element includes a Fresnel lens.

22. The system of claim 19, wherein said first diffractive optical element includes a diffraction grating.

23. The system of claim 19, wherein said illumination system further includes a zoom lens that receives illumination from said first diffractive element.

24. The system of claim 23, wherein said illumination system further includes an axicon that receives illumination from said zoom lens.

25. The system of claim 24, wherein said illumination system further includes a second diffractive optical element that receives illumination from said axicon.

26. The system of claim 25, wherein said second diffractive optical element has a rectangular numerical aperture.

27. The system of claim 25, wherein said second diffractive optical element includes a microlens array.

28. The system of claim 25, wherein said second diffractive optical element includes an array of cylindrical lenses.

29. The system of claim 25, wherein said illumination system further includes a condenser lens that receives illumination from said second diffractive element.

30. The system of claim 25, wherein said illumination system further includes a condenser lens that receives illumination from said second diffractive element, and a relay lens that receives illumination from said condenser lens.

31. An illumination system for microlithography comprising, in order from an objective side:
a first diffractive optical element;
a zoom lens;
a second diffractive optical element having a rectangular numerical aperture;
a condenser lens; and
a relay lens.

32. The system of claim 31, wherein a field size of said illumination system is discretely variable.

33. The system of claim 31, further including a projection optical system, wherein a field size of said system and a partial coherence are both variable.

34. The system of claim 33, wherein said partial coherence is continuously variable between about 0.2 and 0.4.

35. The system of claim 31, wherein said illumination system further includes an axicon between said zoom lens and said second diffractive element.

36. The system of claim 31, wherein said illumination system further includes and axicon between said second diffractive optical element and said zoom lens.

37. The system of claim 31, wherein said second diffractive optical element has a rectangular numerical aperture.

38. The system of claim 31, wherein said second diffractive optical element includes a microlens array.

39. The system of claim 31, wherein said second diffractive optical element includes an array of cylindrical lenses.

40. A system for microlithography comprising:
an illumination system including, in order from an objective side:
(a) a zoom lens having a first diffractive optical element on a first side, and a second diffractive optical element on a second side;
(b) a condenser lens;
(c) a relay lens; and
a projection optical system,
wherein a partial coherence of said system for microlithography is continuously variable.

41. The system of claim 40, wherein a field size of said system for microlithography is discretely adjustable.

42. The system of claim 40, wherein a field size of said system for microlithography is continuously adjustable.

43. The system of claim 40, wherein said partial coherence is continuously variable between 0.2 and 0.4.

44. The system of claim 40, wherein said illumination system further includes an axicon between said zoom lens and said condenser lens.

45. The system of claim 40, wherein said second diffractive optical element has a rectangular numerical aperture.

46. The system of claim 40, wherein said second diffractive optical element includes a microlens array.

47. The system of claim 40, wherein said second diffractive optical element includes an array of cylindrical lenses.

48. A method of exposing a substrate comprising the steps of:
illuminating an illumination optical system that includes, in order from an objective side:
(a) a first diffractive optical element that receives illumination from the illumination source;
(b) a zoom lens;
(c) a second diffractive optical element;
(d) a condenser lens;

(e) a relay lens;
(f) a reticle;
forming a zoomable numerical aperture beam at a plane of the reticle; and
projecting the beam formed in the plane of the reticle onto the substrate through a projection optical system.

49. The method of claim 48, further including the step of varying a field size of the illumination optical system.

50. The method of claim 48, further including the step of discretely varying a field size of the illumination optical system and continuously varying a numerical aperture of the projection optical system.

51. The method of claim 48, further including the step of continuously varying a field size of the illumination optical system.

52. The method of claim 48, wherein said illuminating step includes the step of illuminating a third diffractive optical element positioned between the second diffractive optical element and the condenser lens.

53. The method of claim 48, further including the step of adjusting a position of the third diffractive optical element to continuously adjust a field size of the system.

54. The method of claim 48, further including the step of varying a ratio of a numerical aperture of the illumination system and a numerical aperture of the projection optical system between about 0.2 and 0.4.

55. The method of claim 48, wherein said illuminating step includes the step of illuminating the first diffractive optical element that includes a microlense array.

56. The method of claim 48, wherein said illuminating step includes the step of illuminating the first diffractive optical element that includes a Fresnel lens.

57. The method of claim 48, wherein said illuminating step includes the step of illuminating the first diffractive optical element that includes a diffraction grating.

58. The method of claim 48, wherein said illuminating step includes the step of illuminating an axicon positioned between the zoom lens and the second diffractive element.

59. The method of claim 48, wherein said illuminating step includes the step of illuminating an axicon positioned between the second diffractive element and the condenser lens.

60. The method of claim 48, wherein said illuminating step includes the step of illuminating the second diffractive optical element that has a rectangular numerical aperture.

61. The method of claim 48, wherein said illuminating step includes the step of illuminating the second diffractive optical element that includes a microlens array.

62. The method of claim 48, wherein said illuminating step includes the step of illuminating the second diffractive optical element that includes an array of cylindrical lenses.

63. A method of exposing a substrate comprising the steps of:
illuminating an illumination system that includes, in order from an objective side:
(a) a zoom lens having a first diffractive optical element on a first side, and a second diffractive optical element on a second side;
(b) a condenser lens;
(c) a relay lens; and
projecting a beam formed by the relay lens onto the wafer using a projection optical system; and
continuously varying a partial coherence of an illumination optical system/projection optical system combination.

64. The method of claim 63, further including the step of varying a field size of the illumination optical system.

65. The method of claim 63, further including the step of discretely varying a field size of the illumination optical system and continuously varying a numerical aperture of the projection optical system.

66. The method of claim 63, further including the step of continuously varying a field size of the illumination optical system.

67. The method of claim 63, wherein said illuminating step includes the step of illuminating a third diffractive optical element positioned between the second diffractive optical element and the condenser lens.

68. The method of claim 67, further including the step of adjusting a position of the third diffractive optical element to continuously adjust a field size of the system.

69. The method of claim 63, further including the step of varying a ratio of a numerical aperture of the illumination system and a numerical aperture of the projection optical system between about 0.2 and 0.4.

70. The method of claim 63, wherein said illuminating step includes the step of illuminating the first diffractive optical element that includes a microlense array.

71. The method of claim 63, wherein said illuminating step includes the step of illuminating the first diffractive optical element that includes a Fresnel lens.

72. The method of claim 63, wherein said illuminating step includes the step of illuminating the first diffractive optical element that includes a diffraction grating.

73. The method of claim 63, wherein said illuminating step includes the step of illuminating an axicon positioned between the zoom lens and the second diffractive element.

74. The method of claim 63, wherein said illuminating step includes the step of illuminating an axicon positioned between the second diffractive element and the condenser lens.

75. The method of claim 63, wherein said illuminating step includes the step of illuminating the second diffractive optical element that has a rectangular numerical aperture.

76. The method of claim 63, wherein said illuminating step includes the step of illuminating the second diffractive optical element that includes a microlens array.

77. The method of claim 63, wherein said illuminating step includes the step of illuminating the second diffractive optical element that includes an array of cylindrical lenses.

78. The system of claim 1, wherein the system is a whole field system, a field size of said system is discretely variable.

79. The system of claim 1, wherein the system is a whole field system, and wherein a field size of said system is discretely variable and a ratio of a numerical aperture of said illumination optical system and a numerical aperture of said projection optical system is continuously variable.

80. The system of claim 1, wherein the system is a whole field system, and wherein a field size of said system is continuously variable.

81. The system of claim 31, wherein the system is a whole field system, a field size of said system is discretely variable.

82. The system of claim 31, wherein the system is a whole field system, and and wherein a field size of said system is discretely variable and a ratio of a numerical aperture of said illumination optical system and a numerical aperture of said projection optical system is continuously variable.

83. The system of claim 31, wherein the system is a whole field system, and wherein a field size of said system is continuously variable.

84. The system of claim 40, wherein the system is a whole field system, a field size of said system is discretely variable.

85. The system of claim 40, wherein the system is a whole field system, and and wherein a field size of said system is discretely variable and a ratio of a numerical aperture of said illumination optical system and a numerical aperture of said projection optical system is continuously variable.

86. The system of claim 40, wherein the system is a whole field system, and wherein a field size of said system is continuously variable.

87. The method of claim 48, wherein the system is a whole field system, a field size of said system is discretely variable.

88. The method of claim 48, wherein the system is a whole field system, and and wherein a field size of said system is discretely variable and a ratio of a numerical aperture of said illumination optical system and a numerical aperture of said projection optical system is continuously variable.

89. The method of claim 48, wherein the system is a whole field system, and wherein a field size of said system is continuously variable.

90. The method of claim 63, wherein the system is a whole field system, a field size of said system is discretely variable.

91. The method of claim 63, wherein the system is a whole field system, and and wherein a field size of said system is discretely variable and a ratio of a numerical aperture of said illumination optical system and a numerical aperture of said projection optical system is continuously variable.

92. The method of claim 63, wherein the system is a whole field system, and wherein a field size of said system is continuously variable.

93. The system of claim 1, wherein the zoom lens is a non-imaging zoom lens.

94. The system of claim 18, wherein the zoom lens is a non-imaging zoom lens.

95. The system of claim 31, wherein the zoom lens is a non-imaging zoom lens.

96. The method of claim 48, wherein the zoom lens is a non-imaging zoom lens.

* * * * *

UNITED STATES PATENT AND TRADEMARK OFFICE
CERTIFICATE OF CORRECTION

PATENT NO.   : 6,813,003 B2
DATED        : November 2, 2004
INVENTOR(S)  : Oskotsky et al.

It is certified that error appears in the above-identified patent and that said Letters Patent is hereby corrected as shown below:

Column 14,
Lines 57 and 67, "and and" should appear as -- and --.
Line 67, "said system" should appear as -- said system for microlithography --.

Column 15,
Line 2, "illumination optical system" should appear as -- illumination system --.
Line 11, "and and" should appear as -- and --.

Column 16,
Line 2, "and and" should appear as -- and --.
Line 3, "system" should appear as -- illumination optical system/projection optical system combination --.

Signed and Sealed this

Eighth Day of November, 2005

JON W. DUDAS
*Director of the United States Patent and Trademark Office*